United States Patent [19]
Sato et al.

[11] Patent Number: 5,629,497
[45] Date of Patent: May 13, 1997

[54] PRINTED WIRING BOARD AND METHOD OF MANUFACTURING IN WHICH A BASEFILM INCLUDING CONDUCTIVE CIRCUITS IS COVERED BY A CURED POLYIMIDE RESIN LAY

[75] Inventors: Hiromoto Sato; Junzaburo Shirai, both of Iruma-gun, Japan

[73] Assignee: CMK Corporation, Saitama, Japan

[21] Appl. No.: 538,853

[22] Filed: Oct. 4, 1995

[30] Foreign Application Priority Data

Oct. 4, 1994 [JP] Japan .................... 6-264655
Oct. 4, 1994 [JP] Japan .................... 6-264656

[51] Int. Cl.⁶ .................................. H05K 1/02
[52] U.S. Cl. ............................ 174/255; 174/254
[58] Field of Search ...................... 174/250, 262, 174/254, 253; 361/749; 439/67, 77

[56] References Cited

U.S. PATENT DOCUMENTS

| | | | |
|---|---|---|---|
| 4,800,461 | 1/1989 | Dixon et al. | 361/398 |
| 5,045,642 | 9/1991 | Ohta et al. | 174/266 |
| 5,095,628 | 3/1992 | McKenny et al. | 29/846 |
| 5,262,594 | 11/1993 | Edwin et al. | 174/254 |
| 5,499,444 | 3/1996 | Doane, Jr. et al. | 29/830 |

*Primary Examiner*—Laura Thomas
*Attorney, Agent, or Firm*—Oblon, Spivak, McClelland, Maier & Neustadt, P.C.

[57] ABSTRACT

A prepreg having an opening portion is placed on a cover lay which covers conductive circuits formed on a basefilm. A copper foil sheet is placed on the prepreg in such a way that the copper foil sheet covers the opening portion. The copper foil sheet has no opening portion. Next, the basefilm, the prepreg, and the copper foil are thermocompressed to become one laminate. After making a hole in the laminate, the laminate is plated, and then a through-hole is formed. A conductive circuit is formed by etching the copper foil sheet.

14 Claims, 4 Drawing Sheets

PRINTED WIRING BOARD AND METHOD OF MANUFACTURING IN WHICH A BASEFILM INCLUDING CONDUCTIVE CIRCUITS IS COVERED BY A CURED POLYIMIDE RESIN LAY

BACKGROUND OF THE INVENTION

1. Field of the Invention

The present invention relates to a printed wiring board, and to a method of manufacturing a printed wiring board.

2. Description of the Related Art

In a conventional printed wiring board, it is well-known that two basefilms made from polyimide resin are adhered through an adhesion layer made from polyimide. Conductive circuits are formed on both surfaces of each of the basefilms, and these basefilms are adhered by a bonding sheet made from polyimide resin. Each of the basefilms and the bonding sheet are made from polyimide resin. Material made from polyimide resin has a high flexibility. However, in the process of manufacturing the conventional printed wiring board, because of too high flexibility of layers made from polyimide resin, layer-to-layer registration is so difficult that the relative locations of lands of conductive circuits tends to get out of position.

Further, in the conventional printed wiring board, polyimide resin causes high manufacturing costs.

SUMMARY OF THE INVENTION

The object of the present invention is to provide a printed wiring board in which layer-to-layer registration is easy in the process of manufacturing, and whose manufacturing cost is low.

Note that in this specification, the polyimide-containing resin material may not be pure polyimide resin, but may include other materials, such as expoxy resin, for example.

According to the present invention, the printed wiring board comprises a basefilm having at least one conductive circuit on both surfaces, at least two cover lays, which completely cover both surfaces of the basefilm, and which are made by curing a semirigid bonding sheet made from polyimide-containing resin material, at least two prepregs having opening portions which are laminated onto the at least two cover lays, and at least one conductive circuit formed by etching at least two copper foil sheets which completely covers the at least two prepregs.

Further, according to the present invention, the method for manufacturing of the present invention comprises: a first step in which a prepreg having an opening portion is placed on a cover lay which covers at least one conductive circuit formed on a basefilm, together with a copper foil sheet which is placed on the prepreg in such a way that the opening portion is covered with the copper foil sheet; a second step in which the basefilm, the prepreg and the copper foil sheet are thermocompressed to become laminated layers; a third step in which at least one hole is made to pierce the laminated layers; a fourth step in which the laminated layers having the at least one hole is plated; and a fifth step in which at least one conductive circuit is formed on the copper foil sheet by etching.

Further, according to the present invention, the printed wiring board comprises a basefilm having at least one conductive circuit on both surfaces, at least two cover lays, which completely cover both surfaces of the basefilm, and which are made by curing a semirigid bonding sheet made from polyimide-containing resin material, at least two first prepregs having opening portions which are laminated onto the at least two cover lays, at least two rigid boards having opening portions which are laminated onto the at least two first prepregs, at least two second prepregs having opening portions which are laminated onto the at least two rigid boards, at least one conductive circuit formed by etching at least two copper foil sheets which completely cover the at least two second prepregs.

Furthermore, according to the present invention, the method for manufacturing the printed wiring board comprises: a first step in which a first prepreg, a rigid board, and a second prepreg are placed on a cover lay, which covers at least one conductive circuit formed on a basefilm, in such a way that opening portions formed on the first prepreg, the rigid board, and the second prepreg are substantially overlapped, together with a copper foil sheet is placed on the second prepreg in such a way that the copper foil sheet covers the opening portions; a second step in which the basefilm, the first prepreg, the rigid board, the second prepreg, and the copper foil sheet are thermocompressed to become laminated layers; and a third step in which at least one hole is made to pierce the laminated layers; a fourth step in which the laminated layers having the holes are plated; and a fifth step in which at least one conductive circuit is formed in the copper foil sheet by etching.

BRIEF DESCRIPTION OF THE DRAWINGS

The present invention will be better understood from the description of the preferred embodiments of the invention set forth below, together with the accompanying drawings, in which.

DESCRIPTION OF THE PREFERRED EMBODIMENTS

Note that in this specification, the polyimide-containing resin material may not be pure polyimide resin, but may include other materials, such as expoxy resin, for example.

Figure 1:
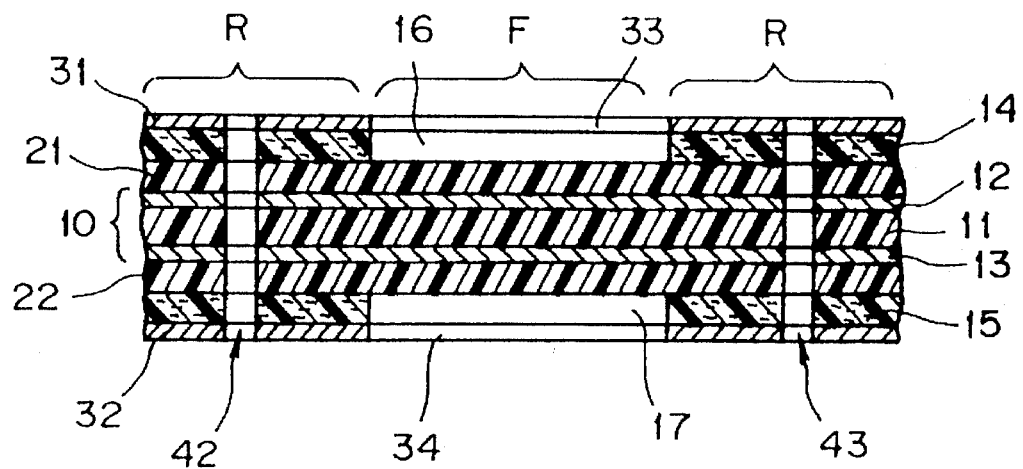
FIG. 1 is a sectional view showing a structure of laminated layers of the printed wiring board of the first embodiment.

The first embodiment according to the present invention will be now described with reference to the accompanying drawing FIG. 1.

In the first embodiment, a basefilm 10 comprises a sheet of material 11, copper foil sheets 12, 13 which are laminated onto both side of the sheet of material 11. Predetermined conductive circuits are formed in the copper foil sheets 12, 13 by etching.

The copper foil sheet 12 is covered with a cover lay 21 made from polyimide-containing resin material. Similarly, the copper foil sheet 13 is covered with a cover lay 22 made from polyimide-containing resin material. The cover lays 21, 22 have a shape substantially similar to that of the basefilm 10.

A prepreg 14, which is made by saturating a glass fiber sheet with epoxy resin, is laminated onto the side of the cover lay 21 opposite to the basefilm 10. An opening portion 16 is provided in the prepreg 14. Similarly, a prepreg 15 is laminated onto the side of the cover lay 22 opposite to the basefilm 10. An opening portion 17 is provided in the prepreg 15. The opening portions 16, 17 are formed at a position at which they are overlapped each other.

A copper foil sheet 31 is laminated onto the prepreg 14. A copper foil sheet 32 is laminated onto the prepreg 15. The copper foil sheets 31, 32 have no opening portion. Namely, they are laminated onto the prepregs 14, 15 so as to cover the opening portions 16, 17. The shapes of the basefilm 10, prepregs 14, 15 and the copper foil sheets 31, 32 are substantially alike.

Through-holes 42, 43 pierce the laminate which comprises the basefilm 10, the cover lays 21, 22, the prepregs 14, 15, and the copper foils sheets 31, 32. Further, conductive circuits are made by etching the copper foil sheets 31, 32.

In this embodiment, due to the rigid prepregs 14, 15, layer-to-layer registration is easily achieved.

Figure 3:
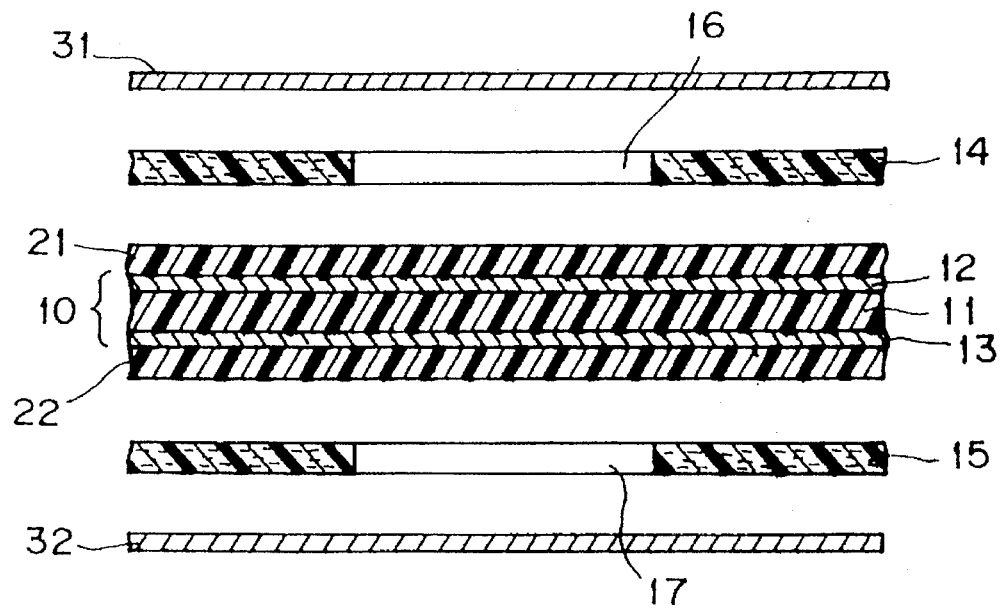
FIG. 2 and FIG. 3 are perspective views showing one process of manufacturing of a printed wiring board of the second embodiment according to the present invention.
Figure 2:
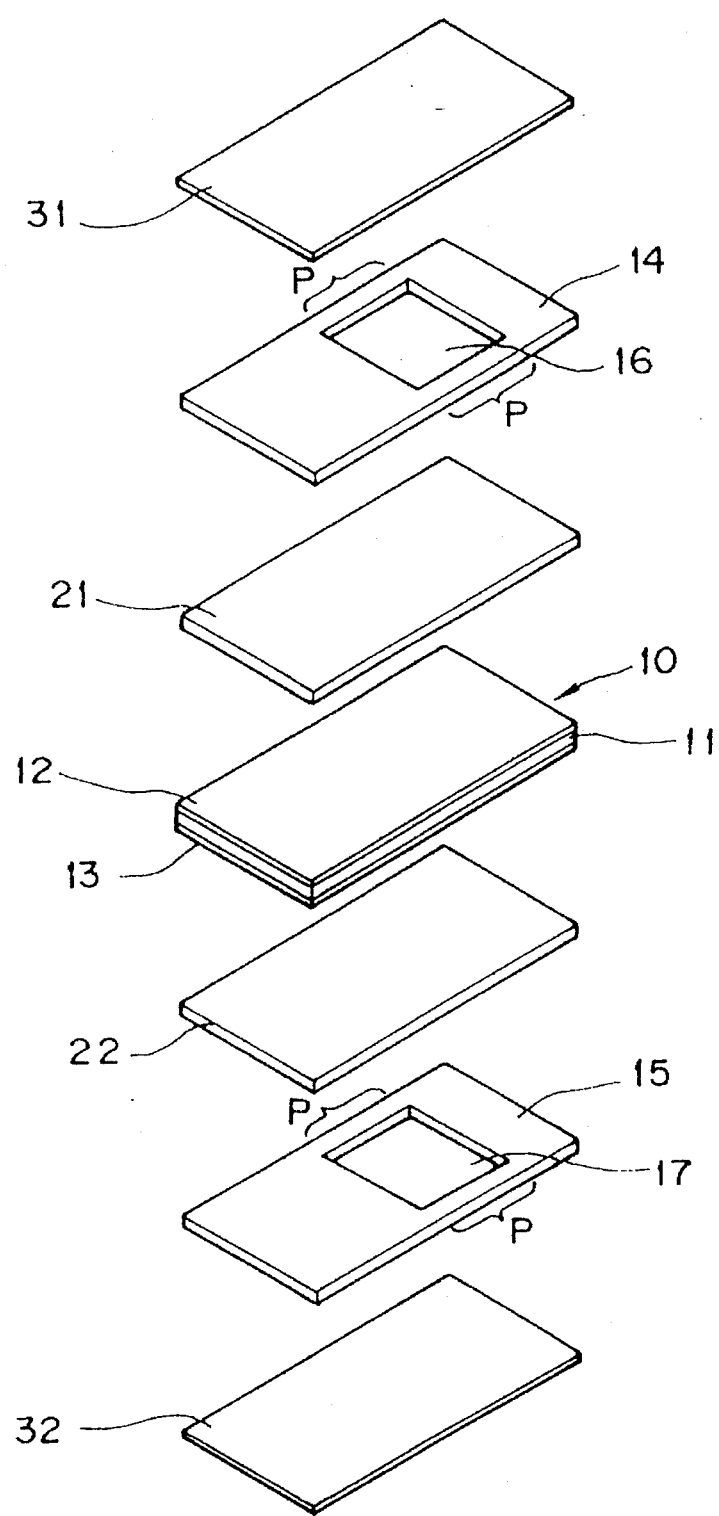

In the second embodiment according to the present invention, as shown in FIG. 2 and FIG. 3, a basefilm 10 is obtained by laminating copper foil sheets 12, 13 on both side of a sheet of material 11 made from polyimide-containing resin material. Predetermined conductive circuits are formed by etching the copper foil sheets 12, 13. The copper foil sheets are covered with cover lays 21, 22 made from polyimide-containing resin material. The cover lay 21 has a shape substantially similar to that of the basefilm 10. The cover lay 21 is made by placing a semirigid bonding sheet made from polyimide-containing resin material onto the copper foil sheet 12 and then thermocompressing both under a predetermined pressure and temperature. The cover lay 22 is also thermocompressed to be laminated onto the copper foil sheet 13 in the same way as the cover lay 21 is formed. Thus, a first laminated layer is constructed of the basefilm 10, the cover lay 21, and the cover lay 22.

A prepreg 14, which is made by saturating a glass fiber sheet with epoxy resin, is placed onto the side of the cover lay 21 opposite to the basefilm 10. An opening portion 16 is provided in the prepreg 14. Similarly, a prepreg 15 is placed onto the side of the cover lay 22 opposite to the basefilm 10. An opening portion 17 is provided in the prepreg 15. The opening portions 16, 17 are formed at a position at which they are overlapped with each other. A copper foil sheet 31 is placed onto the prepreg 14. A copper foil sheet 32 is placed onto the prepreg 15. The copper foil sheets 31, 32 have no opening portion. Namely, they are placed onto the prepregs 14, 15 so as to cover the opening portions 16, 17. The shapes of the basefilm 10, prepregs 14, 15 and the copper foil sheets 31, 32 are substantially alike.

A second laminated layer is obtained by thermocompressing: the prepregs 14, 15; the copper foil sheets 31, 32; the first laminated layer, which comprises the basefilm 10 and the cover lays 21, 22; under predetermined conditions. Next, holes are made at predetermined portions. The almost complete printed wiring board is plated, and thus through-holes 42, 43 (see FIG. 1) are made. Further, conductive circuits are made by etching the copper foil sheets 31, 32. Predetermined portions are covered by solder resist (insulated layer).

After that, each edge P (see FIG. 2) of the opening portions 16, 17 of the prepregs 14, 15 is removed and a flex portion F, at which both sides of the basefilm 10 are covered with the cover lays 21, 22, and which can be bent, is thereby formed. Further, on both sides of the flex portion F (see FIG. 1), a rigid portion R (see FIG. 1), at which the basefilm 10, the cover lays 21, 22, the prepregs 14, 15, and the copper foil sheets 31, 32 are laminated, is formed. Namely, in this printed wiring board, at the rigid portion R, the copper foil sheets 31, 32 are adhered on both sides of the same laminated layers as the flex portion F through the prepregs 14, 15, and holes are pierced at some portions which become the through-holes 42, 43 by plating, and etching is carried out.

In the second embodiment, the flex portion F is not formed by removing one portion of the rigid board as in a conventional printed wiring board, but is formed by using the prepregs in which the opening portions 16, 17 have been previously formed. Further, the opening portions 16, 17 have already been covered with the copper foils 31, 32 before the plating process. Accordingly, ions which are included in the plating liquid do not adhere to the edge surface of the prepregs 14, 15 which are exposed by the opening portions 16, 17, and electric characteristics are not lost. In this embodiment, due to the rigid prepregs 14, 15, layer-to-layer registration is easily achieved.

Furthermore, the first laminated layer and the copper foil sheets 31, 32 are adhered by the prepregs 14, 15. These prepregs are very inexpensive. Accordingly, the cost of manufacturing printed wiring boards can be lower by the present embodiment.

Figure 4:
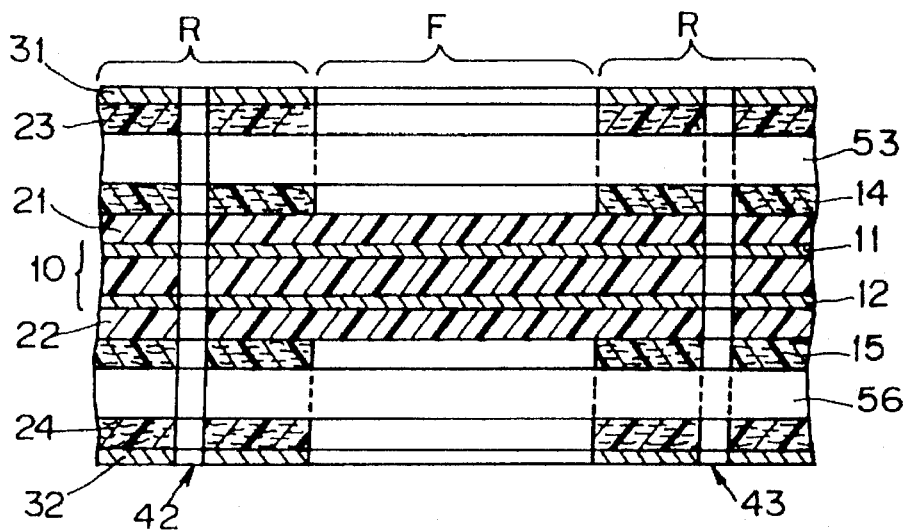
FIG. 4 is a sectional view showing a structure of laminated layers of the printed wiring board of the third embodiment.

The third embodiment according to the present invention will be now described with reference to the accompanying drawing FIG. 4. In the third embodiment, a basefilm 10 comprises a sheet of material, copper foil sheets 11, 12 which are laminated onto both side of the sheet of material. Predetermined conductive circuits are formed in the copper foil sheets 11, 12.

The copper foil sheet 11 is covered with a cover lay 21 made from polyimide-containing resin material. Similarly, the copper foil sheet 12 is covered with a cover lay 22 made from polyimide-containing resin material. The cover lays 21, 22 have a shape substantially similar to that of the basefilm 10.

A first prepreg 14, which is made by saturating a glass fiber sheet with epoxy resin, is laminated onto the side of the cover lay 21 opposite to the basefilm 10. An opening portion is provided in the first prepreg 14. Similarly, a first prepreg 15 is laminated onto the side of the cover lay 22 opposite to the basefilm 10. An opening portion is provided in the first prepreg 15. The opening portions are formed at a position at which they are overlapped with each other.

A rigid board 53, whose both sides are covered by copper foil sheets, is laminated onto the side of the first prepreg 14 opposite to the cover lay 21. A rigid board 56, whose both sides are covered by copper foil sheets, is laminated onto the side of the first prepreg 15 opposite to the cover lay 22.

A second prepreg 23, which is made by saturating a glass fiber sheet with epoxy resin, is laminated onto the side of the rigid board 53 opposite to the first prepreg 14. A second prepreg 24, which is made by saturating a glass fiber sheet with epoxy resin, is laminated onto the side of the rigid board 56 opposite to the first prepreg 15.

A copper foil sheet 31 is laminated onto the second prepreg 23. A copper foil sheet 32 is laminated onto the second prepreg 24. The shapes of the basefilm 10, the first prepregs 14, 15, the rigid boards 53, 56, the second prepregs 23, 24, and the copper foil sheets 31, 32 are substantially alike.

Through-holes 42, 43 pierce the laminate which comprises the basefilm 10, the first prepregs 14, 15, the rigid boards 53, 56, the second prepregs 23, 24, and the copper foil sheets 31, 32. Further, conductive circuits are made by etching the copper foil sheets 31, 32.

In this embodiment, due to the rigid boards 53, 56, layer-to-layer registration can be easily achieved.

Figure 6:
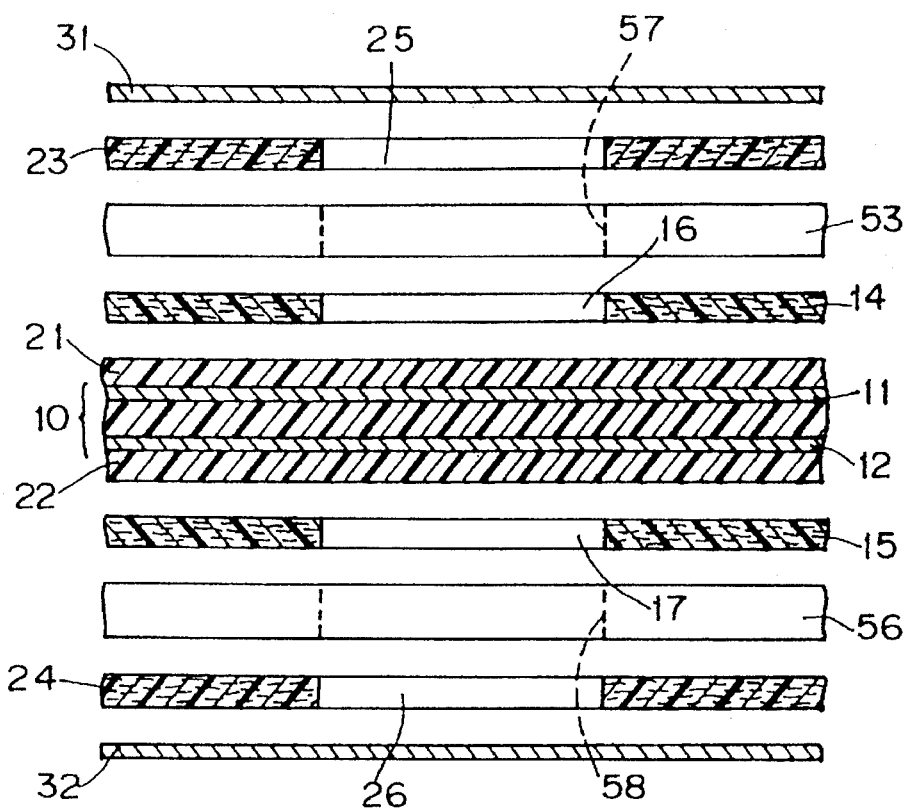
FIG. 5 and FIG. 6 are perspective views showing one process of manufacturing of a printed wiring board of the fourth embodiment according to the present invention.
Figure 5:
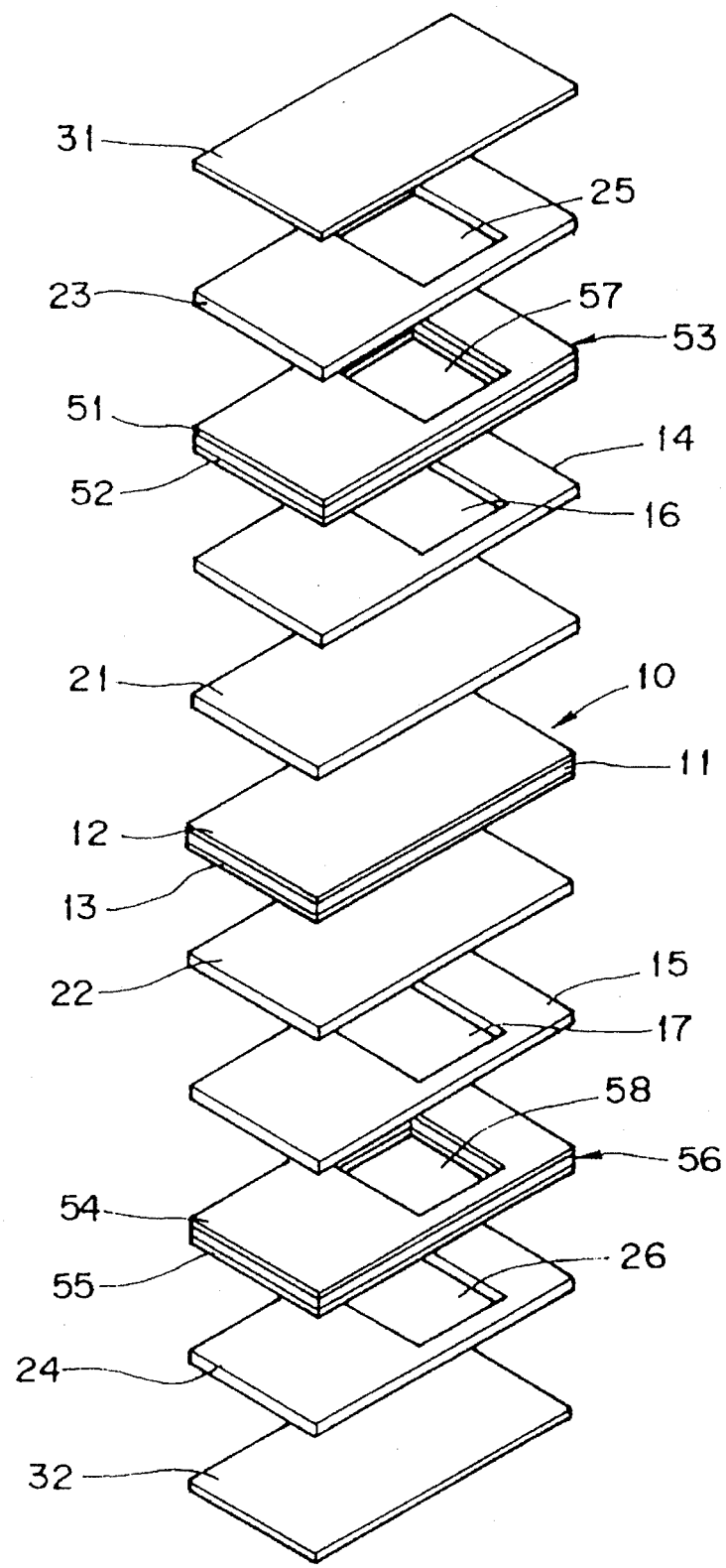

The fourth embodiment according to the present invention will be now described with reference to the accompanying drawings wherein, FIG. 5 and FIG. 6 show one process of manufacturing of the fourth embodiment.

As shown in FIG. 5 and FIG. 6, a rigid board 53, whose both sides are covered by copper foil sheets 51, 52, is placed on the side of the first prepreg 14 opposite to the basefilm 10. A second prepreg 23 is placed on the rigid board 53. A rigid board 56, whose both sides are covered by copper foil sheets 54, 55, is placed on the side of the first prepreg 15 opposite to the basefilm 10. A second prepreg 24 is placed on the rigid board 56. An opening portion 57 is provided in the rigid board 53. An opening portion 58 is provided in the rigid board 56. An opening portion 25 is provided in the second prepreg 23. An opening portion 26 is provided in the second prepreg 26. The first prepregs 14, 15, the rigid boards 53, 56, the second prepregs 23, 24 are placed in such a way that the opening portions 16, 17, 57, 58, 25, 26 are substantially overlapped.

A copper foil sheet 31 is provided on the surface of the second prepreg 23. A copper foil sheet 32 is provided on the surface of the second prepreg 26. The copper foil sheets 31, 32 have no opening portions. They have shapes substantially similar to the basefilm 10. Namely, the copper foil sheets 31, 32 are placed to cover the opening portions 25, 26, etc.

The first prepregs 14, 15, the rigid boards 53, 56, the second prepregs 23, 24, the copper foil sheets 31, 32, and the first laminated layers which are made from the basefilm 10 and the cover lays 21, 22 are thermocompressed under predetermined conditions. A second laminated layer is thus obtained by the thermocompression. Next, after holes are made at predetermined portions, the almost complete printed wiring board is plated, and thus through-holes 42, 43 (see FIG. 6) are made. As can be seen in FIG. 5, the opening portions 16, 17 are covered by the copper foil sheets 31, 32. Further, conductive circuits are made by etching the copper foil sheets 31, 32. Predetermined portions are covered by solder resist (insulated layer).

The edges of the opening portions 16, 17, 25, 26, 57, 58 of the prepregs 14, 15, 23, 24, and the rigid boards 53, 56 are removed as in the second embodiment and the printed wiring board having the flex portion F and the rigid portion R as shown in FIG. 6 is obtained.

Similarly to the second embodiment, the opening portions 16, 17, 25, 26, 57, 58 have already been covered with the copper foil sheets 31, 32 before the plating process. Accordingly, ions which are included in the plating liquid do not adhere to the edge surface of the prepregs 14, 15, 23, 24 which are exposed by the opening portions 16, 17, 25, 26 and electric characteristics of this printed wiring board are not lost.

In this embodiment, due to the rigid boards 53, 56, layer-to-layer registration is easily achieved.

Further, in the this embodiment, the rigid boards 53, 56 and the cover lays 21, 22 are adhered by the first prepregs 14, 15, and the rigid boards 53, 56 and the copper foils sheets are adhered by the second prepregs 23, 24. By the usage of the prepregs for adhesion of the rigid boards 53, 56, cost of manufacturing of a printed wiring board can be lowered.

Furthermore, though in the above embodiments, the number of layers in which the conductive circuits are formed is four or eight, the present invention has no limitation with regard to the structure of the layers of the conductive circuit.

As described above, the present invention offers the effect that the cost of manufacturing of the printed wiring board can be lowered.

Although the embodiments of the present invention have been described herein with reference to the accompanying drawings, obviously many modifications and changes may be made by those skilled in this art without departing from the scope of the invention.

We claim:

1. A printed wiring board comprising:
    a basefilm having at least one conductive circuit on both surfaces;
    at least two cover lays, which completely cover both surfaces of said basefilm, and which are made by curing a semirigid bonding sheet made from polyimide-containing resin material
    at least two prepregs having opening portions which are laminated onto said at least two cover lays; and
    at least one conductive circuit formed by etching at least two copper foil sheets which completely covers said at least two prepregs.

2. A printed wiring board according to claim 1, wherein said at least two prepregs are placed in such a way that said opening portions substantially overlap each other.

3. A printed wiring board according to claim 1, wherein said at least two copper foil sheets are placed to block said opening portions with which said at least two prepregs are provided.

4. A printed wiring board according to claim 1, wherein said at least two prepregs are formed by saturating a glass fiber sheet with epoxy resin or polyimide resin.

5. A method of manufacturing a printed wiring board comprising:
    a first step in which a prepreg having an opening portion is placed on a cover lay which covers at least one conductive circuit formed on a basefilm, together with a copper foil sheet which is placed on the said prepreg in such a way that the said opening portion is covered with said copper foil sheet;
    a third step in which at least one hole is made to pierce said laminated layers;
    a fourth step in which said laminated layers having said at least one hole are plated; and
    a fifth step in which at least one conductive circuit is formed on said copper foil sheet by etching.

6. A method of manufacturing a printed wiring board according to claim 5, wherein at least one conductive circuit is formed on both sides of said basefilm, and said at least conductive circuit is covered by said cover lay, and in said first step, said prepreg is placed on said cover lay.

7. A method of manufacturing a printed wiring board according to claim 5 or claim 6, wherein in said first step, said copper foil sheet has no opening portion.

8. A printed wiring board comprising:
    a basefilm having at least one conductive circuit on both surfaces;
    at least two cover lays, which completely cover both surfaces of said basefilm, and which are made by curing a semirigid bonding sheet made from polyimide-containing resin material;
    at least two first prepregs having opening portions which are laminated onto said at least two cover lays;
    at least two rigid board having opening portions which are laminated onto said at least two first prepregs;
    at least two second prepregs having opening portions which are laminated onto said at least two rigid boards;
    at least one conductive circuit formed by etching at least two copper foil sheets which completely cover said at least two second prepregs.

9. A printed wiring board according to claim 8, wherein said at least two first prepregs, said at least two rigid boards and said at least two second prepregs are placed in such a way that said opening portions substantially overlap each other.

10. A printed wiring board according to claim 8, wherein said at least two copper foil sheets are placed to block said opening portions with which said at least two second prepregs are provided.

11. A printed wiring board according to claim 8, wherein said at least two first prepregs and said at least two second prepregs are formed by saturating a glass fiber sheet with epoxy resin or polyimide resin.

12. A method of manufacturing a printed wiring board comprising:

a first step in which a first prepreg, a rigid board, and a second prepreg are placed on a cover lay, which covers at least one conductive circuit formed on a basefilm, in such a way that opening portions formed on said first prepreg, said rigid board, and said second prepreg are substantially overlapped, together with a copper foil sheet which is placed on said second prepreg in such a way that said copper foil sheet covers said opening portions;

a second step in which said basefilm, said first prepreg, said rigid board, said second prepreg, and said copper foil sheet are thermocompressed to become laminated layers;

a third step in which at least one hole is made to pierce said laminated layers;

a fourth step in which said laminated layers having said hole are plated; and a fifth step in which at least one conductive circuit is formed in said copper foil sheet by etching.

13. A method of manufacturing a printed wiring board according to claim 12, wherein at least one conductive circuit is formed on both sides of said basefilm, and said conductive circuit is covered by said cover lay, and in said first step said first prepreg, said rigid board, said second prepreg, and said copper foil sheet are placed on said cover lays.

14. A method of manufacturing a printed wiring board according to claim 12 or claim 13, wherein in the first step, said copper foil sheet has no opening portion.

* * * * *